United States Patent
Koizumi et al.

[11] Patent Number: 5,546,051
[45] Date of Patent: Aug. 13, 1996

[54] POWER AMPLIFIER AND POWER AMPLIFICATION METHOD

[75] Inventors: Haruhiko Koizumi; Akihisa Sugimura; Kazuki Tateoka, all of Osaka; Kunihiko Kanazawa, Kyoto, all of Japan

[73] Assignee: Matsushita Electric Industrial Co., Ltd., Osaka, Japan

[21] Appl. No.: 402,490

[22] Filed: Mar. 10, 1995

[30] Foreign Application Priority Data

Mar. 14, 1994 [JP] Japan .................. 6-042112

[51] Int. Cl.⁶ .................. H03F 3/04; H04B 1/04
[52] U.S. Cl. .................. 330/297; 455/93; 455/127
[58] Field of Search .................. 330/127, 129, 330/297; 455/93, 127

[56] References Cited

U.S. PATENT DOCUMENTS

| | | |
|---|---|---|
| 5,179,353 | 1/1993 | Miyake .................. 330/129 |
| 5,251,331 | 10/1993 | Schwent et al. .................. 330/297 X |
| 5,423,078 | 6/1995 | Epperson et al. .................. 330/297 X |

FOREIGN PATENT DOCUMENTS

| | | |
|---|---|---|
| 0390360 | 10/1990 | European Pat. Off. . |
| 0482502 | 4/1993 | European Pat. Off. . |
| 5/110348 | 4/1993 | Japan . |

Primary Examiner—Steven Mottola
Attorney, Agent, or Firm—McDermott, Will & Emery

[57] ABSTRACT

In a dual-mode radio telephone transmitter operative in both an analog modulation mode based on the FDMA system and a digital modulation mode based on the TDMA system, a DC bias voltage Vdd to be applied to a power amplification circuit is varied in accordance with the type of modulation, so that the input/output characteristics of the power amplification circuit can be optimized. To this end, a micro processor controls a switch interposed between the power amplification circuit and a positive DC power unit in such a manner that the DC bias voltage Vdd is 4.8 V for the FDMA mode, while the DC bias voltage Vdd is 6.0 V for the TDMA mode. The value of another DC bias voltage Vgg in the power amplification circuit is fixed. The value of the DC bias voltage Vdd is set higher in the TDMA mode than in the FDMA mode; thus, it becomes possible to increase the power added efficiency in the FDMA mode, without adversely affecting high linearity and high efficiency in the TDMA mode.

3 Claims, 7 Drawing Sheets

POWER AMPLIFIER AND POWER AMPLIFICATION METHOD

BACKGROUND OF THE INVENTION

The present invention relates to a mobile radio communication system such as a cellular telephone, operative in both an analog modulation mode and a digital modulation mode.

Recent advancements toward digitization in the field of mobile radio communication systems, such as portable telephones, has been remarkable and automotive vehicle telephones. For this reason, well-known conventional analog modulation systems are gradually being replaced by digital modulation systems, or by dual-mode modulation systems operative in both an analog modulation mode and a digital modulation mode. The dual-mode cellular telephones are advantageous in practical use in view of the fact that the service area available to the digital modulation system is still limited within a specific area.

The components required for the radio transmitter used in such a mobile radio communication, system include a power amplifier for amplifying RF signals of adequate power to be supplied to an antenna. In the dual-mode transmitter, the power amplifier is generally required to have high efficiency in the analog modulation mode, while high linearity is required in addition to high efficiency in the digital modulation mode.

In conventional power amplifiers for transmitters, it is known to switch between two power amplification circuits in accordance with the modulation type required. The simplest arrangement is the provision of two selectable power amplification circuits; one power amplification circuit being dedicated to the analog modulation system and the other power amplification circuit being dedicated to the digital modulation system. Unexamined Japanese patent application No. HEI 5-199127/1993 discloses such a power amplification circuit for a transmitter which includes both a non-linear power amplification circuit and a linear power amplification circuit which may be combined with each other through switches. It is important thing in the analog modulation mode to realize high efficiency; therefore, a non-linear operation region (i.e. in the vicinity of a saturation region) of a non-linear power amplification circuit is preferably utilized. On the other hand, in the digital modulation mode such an arrangement is likely to cause distortions during modulation. To reduce such distortions, a linear operation region of the non-linear power amplification circuit is preferably utilized in a relatively lower output range. Meanwhile, the digital modulation mode, when it is operated in a relatively high power output range, requires the selective use a non-linear power amplification circuit and the linear power amplification circuit in order to realize both high efficiency and high linearity.

However, conventional power amplifiers utilizing the above-described switching technology is cost disadvantageous since it requires two different types of power amplification circuits. In addition, it is further disadvantageous that a significant amount of power loss is realized when each RF signal passes through the switches. Hence, a need exists for a single power amplification circuit which includes the capability of being operated in both the analog modulation mode and the digital modulation mode.

When a single power amplification circuit is operated in both the analog modulation mode and the digital modulation mode, a problem may arise in the power added efficiency, as will be explained in detail below.

The power added efficiency η of the power amplifier is generally defined as follows:

η=(AC Output Power—AC Input Power)/DC Input Power where AC Input Power represents the power of the input RF signal, AC Output Power represents the power of the output RF signal, and DC Input Power represents the power supplied from a DC power unit to the power amplifier. That is, the power added efficiency should be understood as a conversion efficiency from DC power to AC power. In the case of a cellular telephone using a battery as DC power source, it is desirable that the power added efficiency is sufficiently high to prevent premature exhaustion of the battery's stored power.

Radio (wireless) telephone transmitters, used in Japan, must comply with the NTT (Nippon Telegraph and Telephone Corporation) standard when they are operated in the analog modulation mode, or comply with the RCR (Research and Development Center For Radio S System) standard when they are operated in the digital modulation mode. The NTT standard stipulates the Frequency Division Multiple Access (FDMA) system. The RCR standard, under the requirements of Article STD-27B, stipulates the Time Division Multiple Access (TDMA) system. Both the FDMA and TDMA systems require a power amplifier having the same AC output power of 1.5 W.

FIG. 6 is a graph showing a typical example of input/output characteristics and power added efficiency in accordance with a conventional power amplifier of a dual-mode transmitter produced is for use in Japan. This power amplifier includes a single power amplification circuit to which a DC bias voltage Vdd of 6 V is supplied. The power added efficiency in a 1.5 W output condition, as shown in FIG. 6, is approximately 40% in each mode of FDMA (i.e. analog modulation) and TDMA (i.e. digital modulation). In short, this conventional technology causes a problem in forcing the power amplifier to sacrifice the power added efficiency in the FDMA mode in order to realize high linearity in the TDMA mode.

On the other hand, in the United States, there is the TIA (Telecommunications Industry Association) standard applied to the dual-mode radio telephone transmitters. The TIA standard, under the requirements of Article IS-95, stipulates the FDMA system as an access system for the analog modulation mode and the Code Division Multiple Access (CDMA) system as an access system for the digital modulation mode. The FDMA system requires an AC output power of 1.5 W, while the CDMA system requires an AC output power of only 0.5 W.

FIG. 7 is a graph showing an example of input/output characteristics and power added efficiency in accordance with a conventional power amplifier of a dual-mode transmitter produced For use in the Unites States. This power amplifier includes a single power amplification circuit to which a DC bias voltage Vdd of 4.8 V is supplied. The power added efficiency in the FDMA mode is approximately 60% in a 1.5 W output condition, while the power added efficiency in the CDMA mode is approximately 80% in a 0.5 W output condition. In short, this conventional technology causes a problem in forcing the power amplifier to sacrifice the power added efficiency in the CDMA mode in order to realize high efficiency in the FDMA mode.

As explained in the foregoing description, the conventional single-power-amplification-circuit type power amplifier for a transmitter is subject to the problem that, if it is

3 produced for use in Japan, the power added efficiency is worsened in the analog modulation (FDMA) mode or the other problem that, if it is produced for use in the United States, the power added efficiency is worsened in the digital modulation (CDMA) mode. In short, there is an essential problem in that applying either set of standards the power added efficiency is worsened in either the analog or digital modulation modes.

SUMMARY OF THE INVENTION

Accordingly, in view of above-described problems encountered in the prior art, a principal object of the present invention is to provide a power amplifier for a transmitter including an excellent single power amplification circuit operative in both analog and digital modulation modes and capable of achieving high power added efficiency in each of these modulation modes.

In order to accomplish this and other related objects, the present invention provides a power amplifier for a radio transmitter operative in both the analog and digital modulation modes, wherein there are produced two kinds of DC voltages to be applied to a single power amplification circuit; and wherein either of these two kinds of DC voltages may be selectively supplied to the power amplification circuit in accordance with the type of mode, thereby controlling input/output characteristics of the power amplification circuit.

More specifically, in the FDMA/TDMA dual-mode system, the AC output power required is constant irrespective of whether the mode in the analog modulation mode or the digital modulation mode. It is desirable that the input/output characteristics have a higher saturation output in the digital modulation (TDMA) mode than in the analog modulation (FDMA) mode. To realize this, the DC voltage applied to the power amplification circuit in the TDMA mode is set higher than the corresponding voltage in the FDMA mode.

On the other hand, in the case of the FDMA/CDMA dual-mode system, the AC output power required in the digital modulation (CDMA) mode is lower than that required in the analog modulation (FDMA) mode. It is thus desirable that the input/output characteristics have a lower saturation output in the digital modulation (CDMA) mode than in the analog modulation (FDMA) mode. To realize this, the DC voltage applied to the power amplification circuit in the CDMA mode is set lower than the corresponding voltage in the FDMA mode.

Accordingly, for the FDMA/TDMA dual-mode system, the present invention sets the input/output characteristics (i.e. AC input power v.s. AC output power) of the power amplification circuit in such a manner that the saturation output power in the TDMA mode becomes higher than that in the FDMA mode. Hence, it becomes possible to gain high efficiency in the FDMA mode without sacrificing both the high linearity and high efficiency in the TDMA mode. Meanwhile, for the FDMA/CDMA dual-mode system, the present invention sets the input/output characteristics of the power amplification circuit in such a manner that the saturation output power in the CDMA mode becomes lower than that in the FDMA mode. Hence, it becomes possible to gain both high linearity and high efficiency in the CDMA mode without sacrificing the high efficiency in the FDMA mode. As described above, the present invention selectively changes the DC voltage applied to a single power amplification circuit in accordance with the difference of mode between the analog modulation mode and the digital modulation mode, so that the input/output characteristics of the power amplification circuit can be always optimized. Thus, the present invention provides an excellent power amplifier for a transmitter capable of realizing high power added efficiency in either modulation mode.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE INVENTION

Hereinafter, preferred embodiments of the present invention will be explained in greater detail with reference to the accompanying drawings.

(First Embodiment)

Figure 1:
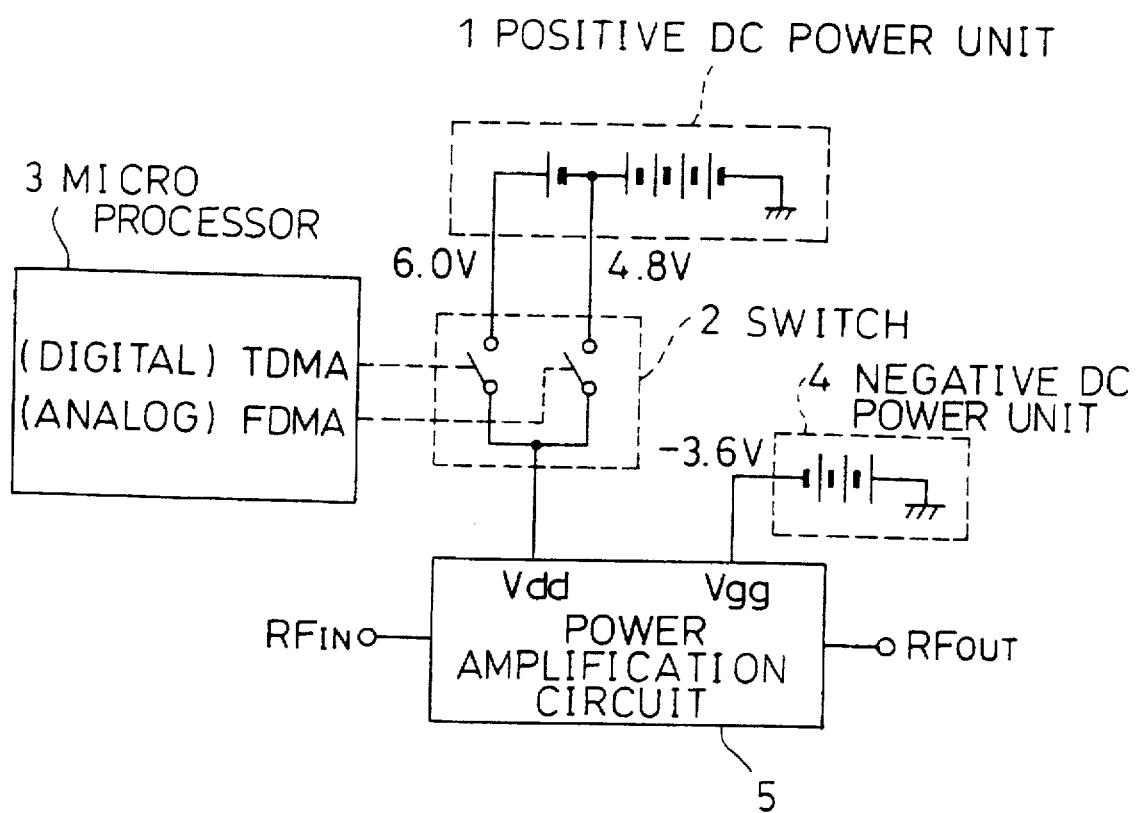
FIG. 1 is a block diagram showing an arrangement of a power amplifier in accordance with a first embodiment of the present invention.

FIG. 1 is a block diagram showing an arrangement of a power amplifier in accordance with the first embodiment of the present invention, which is preferably used for an FDMA/TDMA dual-mode radio (wireless) telephone transmitter in FIG. 1, reference numeral 1 represents a positive polarity DC power unit; reference numeral 2 represents a switch; reference numeral 3 represents a micro processor; reference numeral 4 represents a negative polarity DC power unit; and reference numeral 5 represents a power amplification circuit.

The positive DC power unit i supplies two levels of DC voltage, 4.8 V and 6.0 V. More specifically, 4.8 V is produced by four serially connected nickel-cadmium battery cells, while 6.0 V is produced by five serially connected nickel-cadmium battery cells. The illustrated Ni Cad based positive DC power unit 1, for generating two DC voltage levels, can be replaced by a voltage regulator circuit having the same function.

The switch 2 acts as a selector for selecting either of the two DC voltage levels from the positive polarity DC power unit 1.

The micro processor 3 controls the switch 2 in compliance with a program and determines a preferable DC voltage level to be selected by the switch 2 in accordance with the type of modulation mode. More specifically, the micro processor 3 controls the switch 2 to select 4.8 V when the modulation mode is an analog type (i.e. FDMA) and to select 6.0 V when the modulation mode is a digital type (i.e. TDMA).

The negative DC power unit 4 generates a DC bias voltage of −3.6 V.

The power amplification circuit 5 amplifies radio frequency signals. $RF_{IN}$ represents an RF signal input terminal of the power amplification circuit 5, while $RF_{OUT}$ represents an RF signal output terminal of the power amplification circuit 5. Furthermore, the power amplification circuit 5 has a Vdd terminal for supplying the DC voltage (4.8 V or 6.0 V) selected by the switch 2, and a Vgg terminal supplying the DC bias voltage (−3.6 V) from the negative DC power unit 4.

Figure 2:
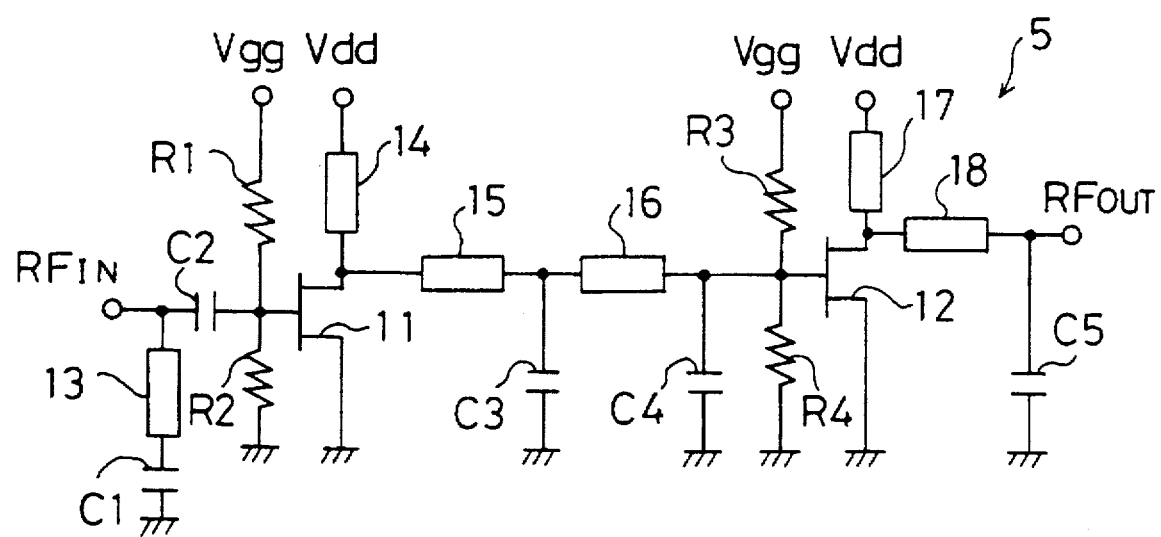
FIG. 2 is a circuit diagram showing detailed arrangement of the power amplification circuit shown in FIG. 1.

FIG. 2 is a circuit diagram showing a detailed arrangement of the power amplification circuit 5 shown in FIG. 1. In FIG. 2, reference numerals 11 and 12 represent field effect transistors (FET); reference numerals 13–18 represent micro strip lines (i.e. inductors); C1–C5 are capacitors; and R1–R4 are resistances.

The DC voltage, entered from the Vdd terminal, is supplied to drain the electrodes of the field effect transistors 11 and 12 via the micro strip lines 14 and 17, respectively. The DC bias voltage, entered from the Vgg terminal, determines the bias of gate electrodes of the field effect transistors 11 and 12. A preferable transistor type adoptable as the field effect transistors 11 and 12 comprises, for example, a GaAs-MESFET since it will handle RF signals of approximately 1 GHz. Instead, it is also possible to use bipolar transistors, MOSFETs, or hereto-bipolar transistors (HBTs) which utilize the junction between heterogeneous materials, such as GaAs and AlGaAs.

Figure 3:
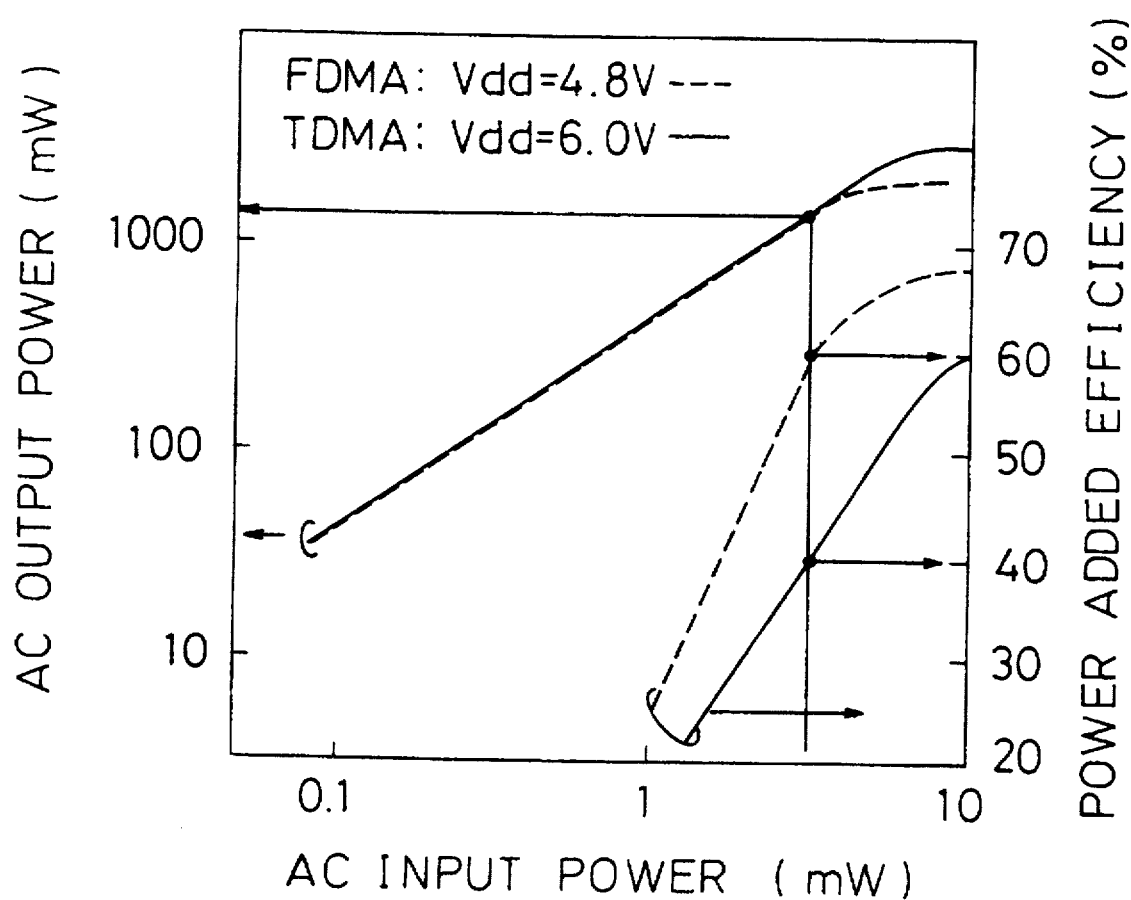
FIG. 3 is a graph showing changes of input/output characteristics and power added efficiency of the power amplifier shown in FIG. 1 obtained by switching the DC bias voltage Vdd in the power amplification circuit.

FIG. 3 is a graph showing changes of input/output characteristics and power added efficiency of the power amplifier shown in FIG. 1 obtained by switching the DC bias voltage Vdd in the power amplification circuit 5. According to the input/output characteristics (dotted line in FIG. 3) in the analog modulation (i.e. FDMA) mode, its saturation output power is 1.5 W. According to the input/output characteristics (solid line in FIG. 3) of the digital modulation (i.e. TDMA) mode, its saturation output power is 2.8 W. By switching the voltage to be supplied to the power amplification circuit 5, the power added efficiency becomes approximately 60% for the FDMA mode and approximately 40% for the TDMA mode when the output power is 1.5 W.

Figure 6:
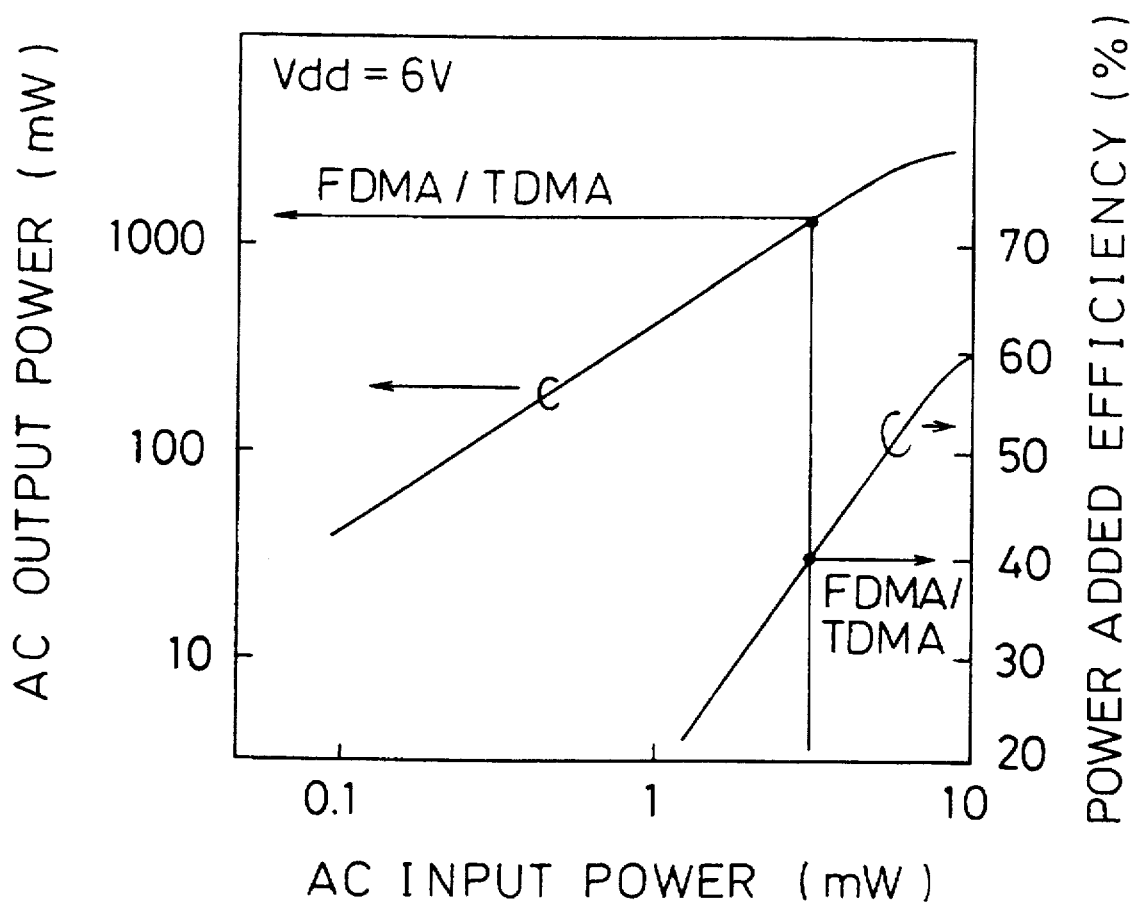
FIG. 6 is a graph showing an example of input/output characteristics and power added efficiency in accordance with a conventional power amplifier.

As explained above, according to this embodiment, the power added efficiency in the FDMA mode can be improved by approximately 20% compared with the conventional example of FIG. 6. Thus, the effect is quite dramatic.

(Second Embodiment)

Figure 4:
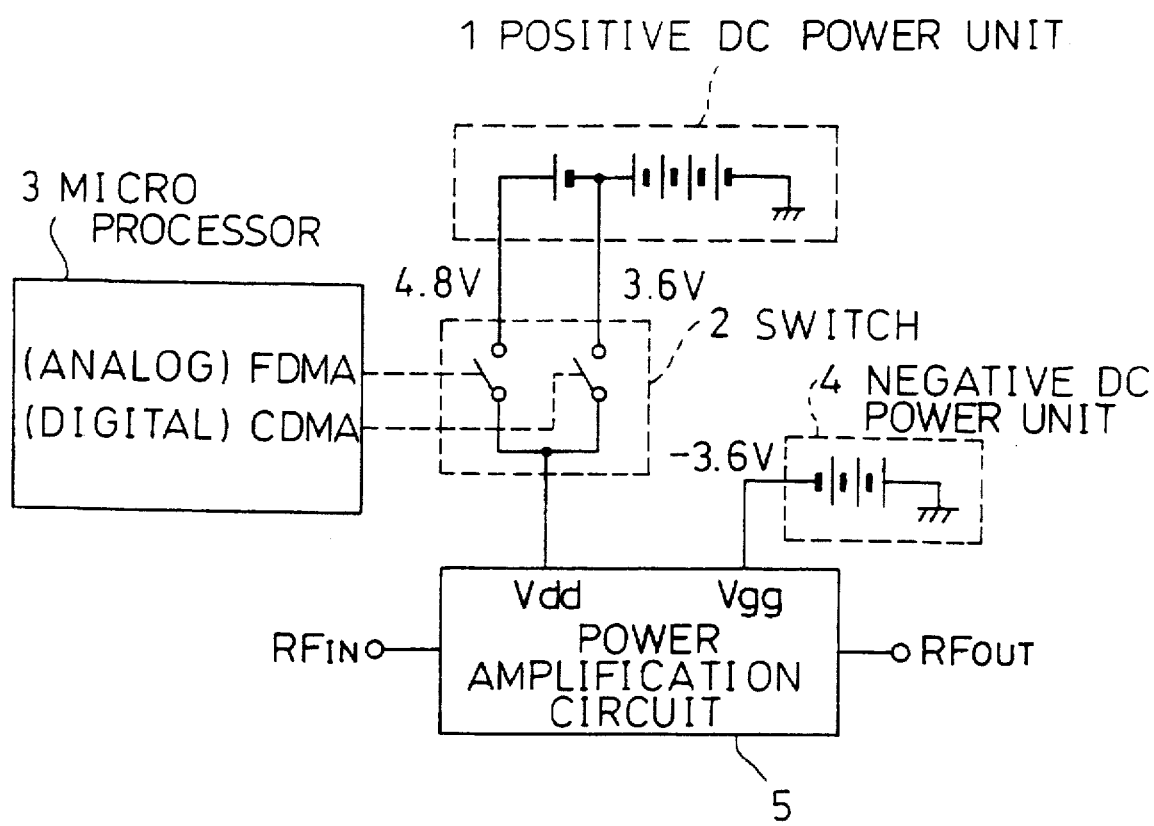
FIG. 4 is a block diagram showing an arrangement of a power amplifier in accordance with a second embodiment of the present invention.

FIG. 4 is a block diagram showing an arrangement of a power amplifier in accordance with the second embodiment of the present invention, which is preferably used for an FDMA/CDMA dual-mode radio (wireless) telephone transmitter. This embodiment is different from the FIG. 1 embodiment in that the DC voltages produced from the positive DC power unit 1 are 3.6 V and 4.8 V. The micro processor 3 controls the switch 2 to select 4.8 V when the modulation type is an analog type (i.e. FDMA) and to select 3.6 V when the modulation type is a digital type (i.e. CDMA). The negative DC power unit 4 and the power amplification circuit 5 have the same construction as those of the above-described first embodiment.

Figure 5:
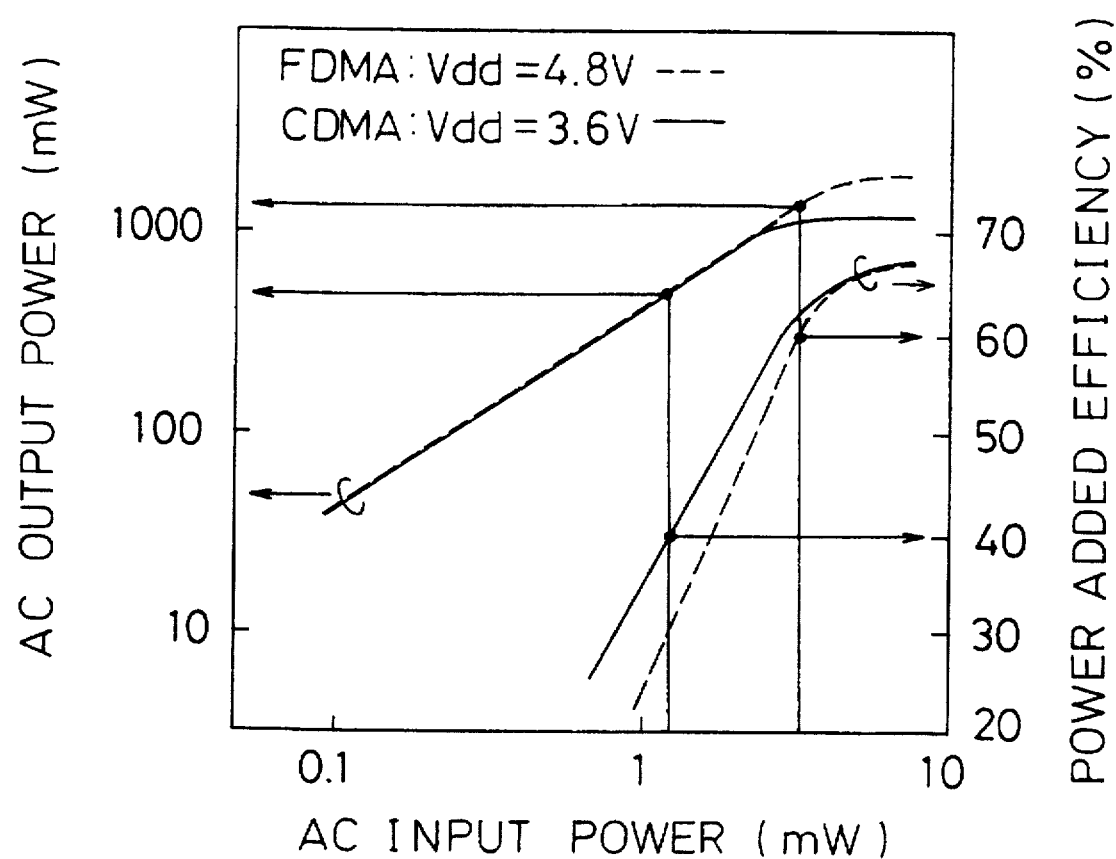
FIG. 5 is a graph showing changes of input/output characteristics and power added efficiency of the power amplifier shown in FIG. 4 obtained by switching the DC bias voltage Vdd in the power amplification circuit.

FIG. 5 is a graph showing changes of input/output characteristics and power added efficiency of the power amplifier shown in FIG. 4 obtained by switching the DC bias voltage Vdd in the power amplification circuit 5. According to the input/output characteristics (dotted line in FIG. 5) of the analog modulation (i.e. FDMA) mode, its saturation output power is higher than that of the input/output characteristics (solid line in FIG. 5) in the digital modulation (i.e. CDMA) mode. By switching the voltage to be supplied to the power amplification circuit 5, the power added efficiency becomes approximately 60% for the FDMA mode when the output power is 1.5 W and approximately 40% for the CDMA mode when the output power is 0.5 W.

Figure 7:
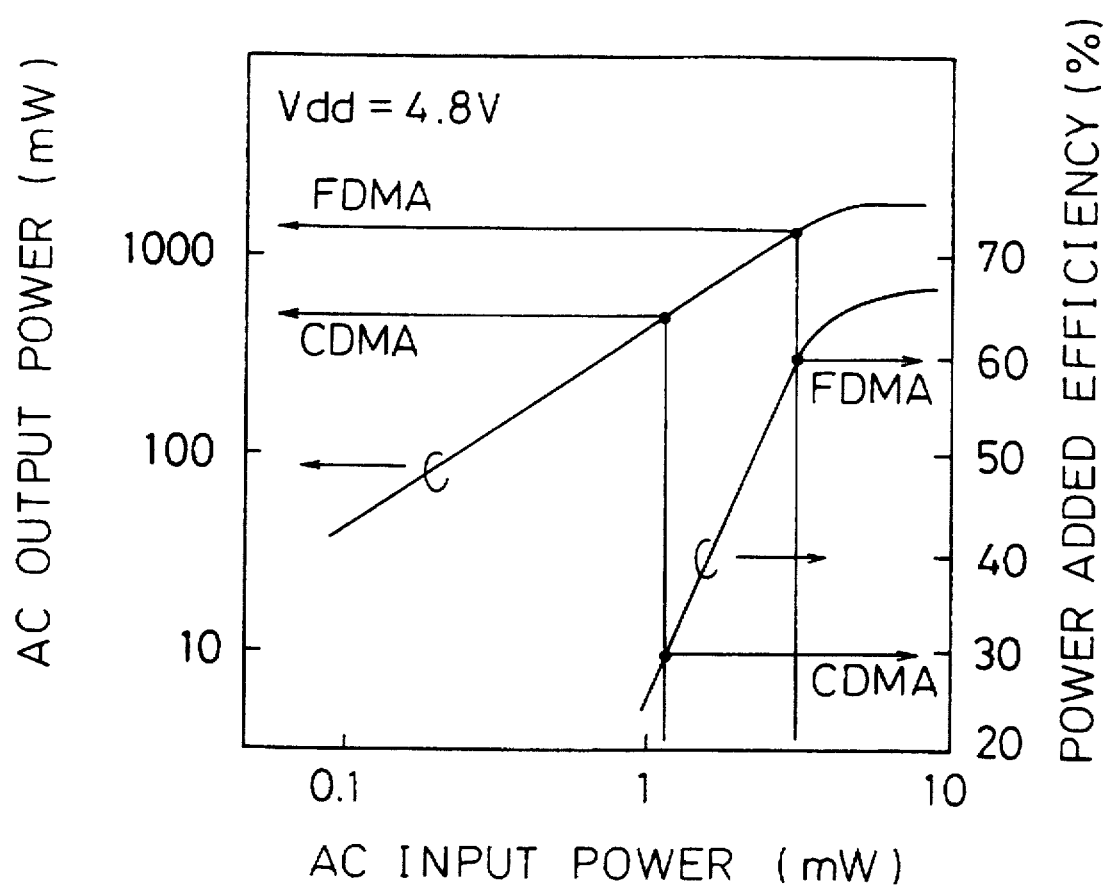
FIG. 7 is a graph showing an example of input/output characteristics and power added efficiency in accordance with another conventional power amplifier.

As explained above, according to this embodiment, the power added efficiency in the CDMA mode can be improved by approximately 10% compared with the conventional example of FIG. 7. Thus, the effect is quite dramatic.

The values Vdd and Vgg adopted in the above-described embodiments can be varied in accordance with the individual internal arrangement of the power amplification circuit 5. Furthermore, the present invention can be applied to other devices, such as power amplifiers of radio transmitters dedicated to data transmission, rather than wireless telephone transmitters dedicated to voice transmission.

As this invention may be embodied in several forms without departing from the spirit of essential characteristics thereof, the present embodiments as described are therefore intended to be only illustrative and not restrictive; and the scope of the invention is defined by the appended claims rather than by the description preceding them. A changes that fall within the metes and bounds of the claims, or equivalents of such metes and bounds, are therefore intended to be embraced by the claims.

What is claimed is:

1. A power amplifier operative in both an analog modulation mode and a digital modulation mode comprising:

a power unit circuit for producing two DC voltage levels:

a switch circuit for selecting either of said two DC voltage levels produced from said power unit circuit:

a control circuit for controlling said switch circuit in accordance with a type of modulation mode:

a single power amplification circuit for amplifying radio frequency signals using the DC voltage level selected by said switch circuit: and wherein said switch circuit is operable to select a lower of said DC voltage levels as a voltage to be applied to the power amplification circuit in the digital modulation mode and to select a higher of said DC voltage levels in the analog modulation mode.

2. The power amplifier in accordance with claim 1, wherein said power amplification circuit is used for a wireless telephone transmitter.

3. The power amplifier in accordance with claim 1, wherein Frequency Division Multiple Access (FDMA) system is used as an access system for said analog modulation mode, while Code Division Multiple Access (CDMA) system is used as an access system For said digital modulation mode.

* * * * *

UNITED STATES PATENT AND TRADEMARK OFFICE
CERTIFICATE OF CORRECTION

PATENT NO. : 5,546,051
DATED : August 13, 1996
INVENTOR(S) : H. KOIZUMI et al.

It is certified that error appears in the above-indentified patent and that said Letters Patent is hereby corrected as shown below:

Col. 6, line 63, after "system" change "For" to --for--.

Signed and Sealed this

Twenty-fifth Day of March, 1997

Attest:

BRUCE LEHMAN

Attesting Officer

Commissioner of Patents and Trademarks